(12) United States Patent
Byun (10) Patent No.: US 9,300,303 B2
(45) Date of Patent: Mar. 29, 2016

(54) METHOD AND APPARATUS FOR CONTROLLING SUPPLY VOLTAGE OF CLOCK AND DATA RECOVERY CIRCUIT

(71) Applicant: Dongguk University Industry Academic Cooperation Foundation, Seoul (KR)

(72) Inventor: Sang-Jin Byun, Seoul (KR)

(73) Assignee: Dongguk University Industry-Academic Cooperation Foundation, Seoul (KR)

( * ) Notice: Subject to any disclaimer, the term of this patent is extended or adjusted under 35 U.S.C. 154(b) by 0 days.

(21) Appl. No.: 14/555,938

(22) Filed: Nov. 28, 2014

(65) Prior Publication Data

US 2015/0146833 A1    May 28, 2015

(30) Foreign Application Priority Data

Nov. 28, 2013  (KR) .......................... 10 2013 0146529

(51) Int. Cl.
| | |
|---|---|
| H04L 7/00 | (2006.01) |
| H03L 7/08 | (2006.01) |
| H03L 7/095 | (2006.01) |
| H02M 3/158 | (2006.01) |
| H04L 7/033 | (2006.01) |

(52) U.S. Cl.
CPC ............ *H03L 7/0802* (2013.01); *H03L 7/0807* (2013.01); *H03L 7/095* (2013.01); *H02M 3/158* (2013.01); *H04L 7/033* (2013.01)

(58) Field of Classification Search
CPC ..... H03L 7/0802; H03L 7/0807; H03L 7/095; H02M 3/158; H02M 3/1582; H04L 7/0016; H04L 7/033; H04L 7/0337; H04L 7/0814; H04L 7/0338; G06F 1/10

USPC .......................... 375/371, 354, 295, 316, 219
See application file for complete search history.

(56) References Cited

U.S. PATENT DOCUMENTS

| | | | | |
|---|---|---|---|---|
| 2005/0127887 A1* | 6/2005 | Kozaki | ........................... | 323/283 |
| 2011/0101932 A1* | 5/2011 | Nakazono | ..................... | 323/271 |
| 2011/0234287 A1* | 9/2011 | Murray | .......................... | 327/299 |
| 2011/0311012 A1* | 12/2011 | Chen et al. | ..................... | 375/376 |

* cited by examiner

*Primary Examiner* — Zewdu Kassa
(74) *Attorney, Agent, or Firm* — Grossman Tucker Perreault & Pfleger, PLLC (57) ABSTRACT

The present invention relates to a method and apparatus for controlling supply voltage of clock and data recovery circuit. According to an embodiment, there is provided an apparatus for controlling supply voltage of clock and data recovery circuit comprising a frequency lock detector configured to compare a frequency of a recovered clock signal with a frequency of a reference clock signal periodically and output a digital value corresponding to the result determined as that the frequency of recovered clock signal is higher than, lower than, or equal to the frequency of a reference clock signal; a digital counter configured to receive the digital value from the frequency lock detector and convert to a counter value based on the digital value; a digital-to-analog converter configured to receive the counter value from the digital counter and generate analog reference voltage corresponding to the counter value; a DC-DC converter configured to receive the analog reference voltage from the digital-to-analog converter and output supply voltage corresponding to the analog reference voltage; and a clock and data recovery circuit configured to receive the supply voltage from the DC-DC converter and generate the recovered clock signal and recovered digital data from a received digital input signal by using the supply voltage.

10 Claims, 11 Drawing Sheets

METHOD AND APPARATUS FOR CONTROLLING SUPPLY VOLTAGE OF CLOCK AND DATA RECOVERY CIRCUIT

CROSS-REFERENCE TO RELATED APPLICATIONS

This application claims the benefit of Korean Patent Application No. 10-2013-0146529, filed with the Korean Intellectual Property Office on Nov. 28, 2013, the disclosure of which is incorporated herein by reference in its entirety.

BACKGROUND

1. Technical Field

The present invention relates to a method and apparatus for controlling supply voltage of clock and data recovery circuit.

2. Background Art

Clock and data recovery circuit is an apparatus which recovers a clock signal which is synchronized to a received digital input signal, and further recovers digital data by using the recovered clock signal. The clock and data recovery circuit has been widely used in LANs for high-speed data transmissions, wireline and wireless communications and optical communications, disc drives, display data transmissions and data transmissions between chips, etc.

Conventional clock and data recovery circuits use a fixed supply voltage regardless of data transmission speeds of received digital input signals. Thus, power consumption for the clock and data recovery circuit is similar regardless of high or low data transmission speeds of received digital input signals. This is inefficient in terms of energy consumption since it means that energy consumption used for recovering received data per a bit is higher when data transmission speed of a received digital input signal is low.

SUMMARY

Embodiments of the present invention provide a method and apparatus for controlling supply voltage of clock and data recovery circuit which is able to control supply voltage according to data transmission speeds of received digital input signals to save energy.

According to an embodiment of the present invention, there is provided an apparatus for controlling supply voltage of clock and data recovery circuit comprising: a frequency lock detector configured to compare a frequency of a recovered clock signal with a frequency of a reference clock signal periodically and output a digital value corresponding to the result determined as that the frequency of recovered clock signal is higher than, lower than, or equal to the frequency of a reference clock signal; a digital counter configured to receive the digital value from the frequency lock detector and converting to a counter value based on the digital value; a digital-to-analog converter configured to receive the counter value from the digital counter and generate analog reference voltage corresponding to the counter value; a DC-DC converter configured to receive the analog reference voltage from the digital-to-analog converter and output supply voltage corresponding to the analog reference voltage; and a clock and data recovery circuit configured to receive the supply voltage from the DC-DC converter and generate the recovered clock signal and recovered digital data from a received digital input signal by using the supply voltage.

In an embodiment of the present invention, the frequency lock detector may comprise: a first clock counter configured to receive the reference clock signal and obtain the number of clock edges of the reference clock signal; a second clock counter configured to receive the recovered clock signal and obtaining the number of clock edges of the recovered clock signal; and a lock determining part configured to receive the number of clock edges of the reference clock signal and the number of clock edges of the recovered clock signal, determine frequency lock by using the difference between the number of clock edges of the reference clock signal and the number of clock edges of the recovered clock signal, and output a digital value corresponding to the result determined as that the frequency of recovered clock signal is higher than, lower than, or equal to the frequency of a reference clock signal.

In another embodiment of the present invention, the digital value may be 2 bits to represent for when the frequency of recovered clock signal may be higher than, lower than, or equal to the frequency of a reference clock signal, the digital value may be 1 bit to represent for when the frequency of recovered clock signal may be higher than or equal to the frequency of a reference clock signal, or the digital value may be 1 bit to represent for when the frequency of recovered clock signal may be lower than or equal to the frequency of a reference clock signal.

In still another embodiment of the present invention, the DC-DC converter may be one of a buck converter, a boost converter and a buck-boost converter.

In still another embodiment of the present invention, the DC-DC converter may comprise: an amplifier configured to amplify the difference voltage between the analog reference voltage and the supply voltage outputted from the DC-DC converter; a PWM controlling circuit configured to receive the amplified difference voltage from the amplifier and a ramp clock signal and generate a PWM signal from the amplified difference voltage and the ramp clock signal; and a driving circuit configured to drive a PMOS transistor and an NMOS transistor based on the PWM signal.

According to another embodiment of the present invention, there is provided a method for controlling supply voltage of clock and data recovery circuit comprising: comparing, by a frequency lock detector, a frequency of a recovered clock signal with a frequency of a reference clock signal periodically and outputting, by the frequency lock detector, a digital value corresponding to the result determined as that the frequency of recovered clock signal may be higher than, lower than, or equal to the frequency of a reference clock signal; receiving, by a digital counter, the digital value from the frequency lock detector and converting, by the digital counter, to a counter value based on the digital value; receiving, by a digital-to-analog converter, the counter value from the digital counter and generating, by the digital-to-analog converter, analog reference voltage corresponding to the counter value; receiving, by a DC-DC converter, the analog reference voltage from the digital-to-analog converter and outputting, by the DC-DC converter, supply voltage corresponding to the analog reference voltage; and receiving, by a clock and data recovery circuit, the supply voltage from the DC-DC converter and generating, by the clock and data recovery circuit, the recovered clock signal and recovered digital data from a received digital input signal by using the supply voltage.

In another embodiment of the present invention, the outputting a digital value by a frequency lock detector may comprise: receiving the reference clock signal and obtaining the number of clock edges of the reference clock signal by a first clock counter; receiving the recovered clock signal and obtaining the number of clock edges of the recovered clock signal by a second clock counter; and receiving the number of clock edges of the reference clock signal and the number of clock edges of the recovered clock signal, determining frequency lock by using the difference between the number of clock edges of the reference clock signal and the number of clock edges of the recovered clock signal, and outputting a digital value corresponding to the result determined as that the frequency of recovered clock signal may be higher than, lower than, or equal to the frequency of a reference clock.

In still another embodiment of the present invention, the digital value may be 2 bits to represent for when the frequency of recovered clock signal may be higher than, lower than, or equal to the frequency of a reference clock signal, the digital value may be 1 bit to represent for when the frequency of recovered clock signal may be higher than or equal to the frequency of a reference clock signal, or the digital value may be 1 bit to represent for when the frequency of recovered clock signal may be lower than or equal to the frequency of a reference clock signal.

In still another embodiment of the present invention, the DC-DC converter may be one of a buck converter, a boost converter and a buck-boost converter.

In still another embodiment of the present invention, the outputting supply voltage by a DC-DC converter may comprise: amplifying the difference voltage between the analog reference voltage and the supply voltage outputted from the DC-DC converter by an amplifier; receiving the amplified difference voltage from the amplifier and a ramp clock signal and generating a PWM signal from the amplified difference voltage and the ramp clock signal by a PWM controlling circuit; and driving a PMOS transistor and an NMOS transistor based on the PWM signal by a driving circuit.

The method and apparatus for controlling supply voltage of clock and data recovery circuit according to an embodiment of the present invention allows energy savings by controlling supply voltage according to data transmission speeds of received digital input signals.

DESCRIPTION OF THE EXEMPLARY EMBODIMENTS

While the present invention has been described with reference to particular embodiments, it is to be appreciated that various changes and modifications may be made by those skilled in the art without departing from the spirit and scope of the present invention, as defined by the appended claims and their equivalents. The terms used in the description are defined by considering their functions in the present invention and selected from currently widely used ones. However, they can be changed according to the intention, convention, etc. of the user or operator, or the appearance of new technologies. In addition, certain terms are defined by the applicant but meanings of such terms will be described in the description of the present invention. Therefore, it is to be appreciated that the terms used in the description should be interpreted by actual meanings of the terms and based on contents throughout the description of the present invention.

Hereinafter, exemplary embodiments of the present invention will be described in detail with reference to the accompanying drawings.

Figure 1:
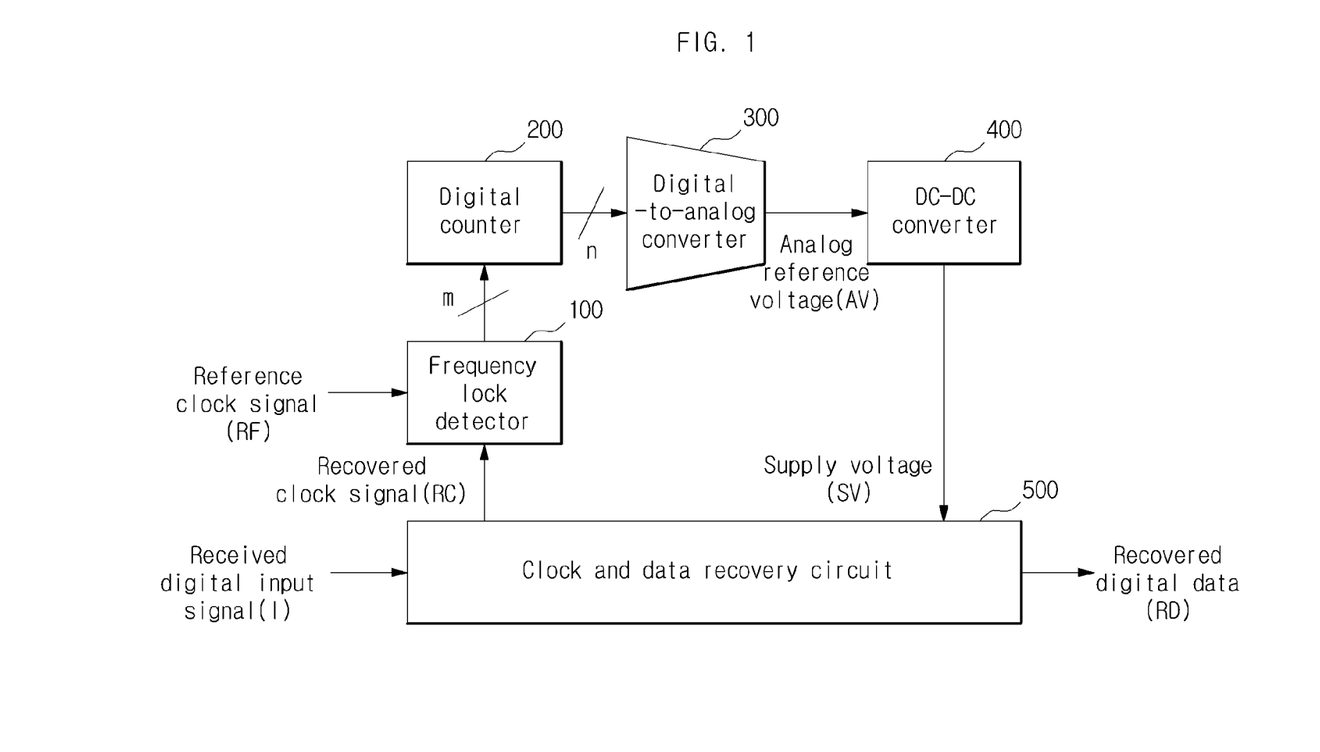
FIG. 1 is a block diagram illustrating an apparatus for controlling supply voltage of clock and data recovery circuit according to an embodiment of the present invention.

FIG. 1 is a block diagram illustrating an apparatus for controlling supply voltage of clock and data recovery circuit according to an embodiment of the present invention.

Referring to FIG. 1, an apparatus for controlling supply voltage of clock and data recovery circuit according to an embodiment of the present invention may include a frequency lock detector 100, a digital counter 200, a digital-to-analog converter 300, a DC-DC converter 400, and a clock and data recovery circuit 500.

The frequency lock detector 100 may compare periodically frequency of a recovered clock signal with frequency of a reference clock signal and output a digital value corresponding to the result determined as that the frequency of a recovered clock signal is higher than, lower than or equal to the frequency of a reference clock signal. Here, the digital value may be represented by m bits which may be a 1 bit or 2 bits. m may be 2 to represent for when the frequency of a recovered clock signal(RC) is higher than, lower than, or equal to the frequency of a reference clock signal(RF), it may be 1 to represent only for when the frequency of a recovered clock signal(RC) is higher than or equal to the frequency of a reference clock signal(RF). It may be also 1 to represent only for when the frequency of a recovered clock signal(RC) is lower than or equal to the frequency of a reference clock signal(RF).

The digital counter 200 may receive a digital value from the frequency lock detector 100 and convert it to a counter value based on the digital value. For example, the digital counter 200 may increase, decrease or maintain a counter value of n bit according to the digital value of m bit.

The digital-to-analog converter 300 may receive the counter value from the digital counter 200 and generate an analog reference voltage(AV) corresponding to the counter value.

The DC-DC converter 400 may receive the analog reference voltage(AV) from the digital-to-analog converter 300 and output supply voltage(SV) corresponding to the analog reference voltage(AV).

The clock and data recovery circuit 500 may receive the supply voltage (SV) from the DC-DC converter 400 and generate recovered clock signal(RC) and recovered digital data(RD) from the received digital input signal(I).

In an embodiment of the present invention, let's assume that when the frequency of a reference clock signal(RF) is 1 GHz and data transmission speed of the received digital input signal(I) is 1 Gbps, the frequency of recovered clock signal (RC) is 1 GHz and at least 1V or above of supply voltage(SV) is required for the clock and data recovery circuit 500 in order to recover the clock signal(RC) of 1 GHz and the digital data(RD) of 1 Gbps from the digital input signal(I) having 1 Gbps of transmission speed.

Now, if the current supply voltage(SV) is 0.6V, the frequency lock detector 100 may determine that the frequency of a recovered clock signal(RC) is lower than the frequency of a reference clock signal(RF) since the frequency of a recovered clock signal(RC) is less than 1 GHz or 0 Hz because a voltage controlled oscillator 540 does not operate. Thus, the digital counter 200 can increase the counter value of n bit.

Analog reference voltage(AV) generated from the digital-to-analog converter 300 may increase according to the counter value of n bit and further supply voltage(SV) of the clock and data recovery circuit 500 may increase. Control of the supply voltage(SV) in a closed loop is performed repeatedly each time the output of the digital value of m bit is subjected, corresponding to the result after frequency lock detector 100 compares periodically the frequency of a reference clock signal(RF) with the frequency of recovered clock signal(RC). Therefore, when the supply voltage(SV) of the clock and data recovery circuit 500 gradually increases from 0.6V to 1.0V, the frequency lock detector 100 may determine that the frequency of recovered clock signal(RC) is equal to the frequency of a reference clock signal(RF).

In this case, the digital counter 200 maintains the counter value of n bits without increasing anymore. The supply voltage(SV) to be finally maintained is 1.0V which may be set as the lowest voltage for the clock and data recovery circuit 500 to recover the clock signal(RC) of 1 GHz and the digital data(RD) of 1 Gbps from the received digital input signal(I) of 1 Gbps.

In still another embodiment of the present invention, when it is assumed that a current supply voltage(SV) is 1.2V which is higher than 1.0V of the least supply voltage(SV) which is required for the clock and data recovery circuit 500 to recover the clock signal(RC) of 1 GHz and the digital data(RD) of 1 Gbps from the digital input signal(I) having a transmission speed of 1 Gbps, the lock determining part 130 of the frequency lock detector 100 may first control to decrease the counter value of n bits of the digital counter 200 till the frequency of a recovered clock signal(RC) becomes less than the frequency of a reference clock signal(RF). Then, the supply voltage(SV) can be set to the lowest voltage for the clock and data recovery circuit 500 to recover the clock signal(RC) of 1 GHz and the digital data(RD) of 1 Gbps from the digital input signal(I) of 1 Gbps by increasing the counter value of n bits of the digital counter 200 till the frequency of a recovered clock signal(RC) becomes equal to the frequency of a reference clock signal(RF).

Figure 2:
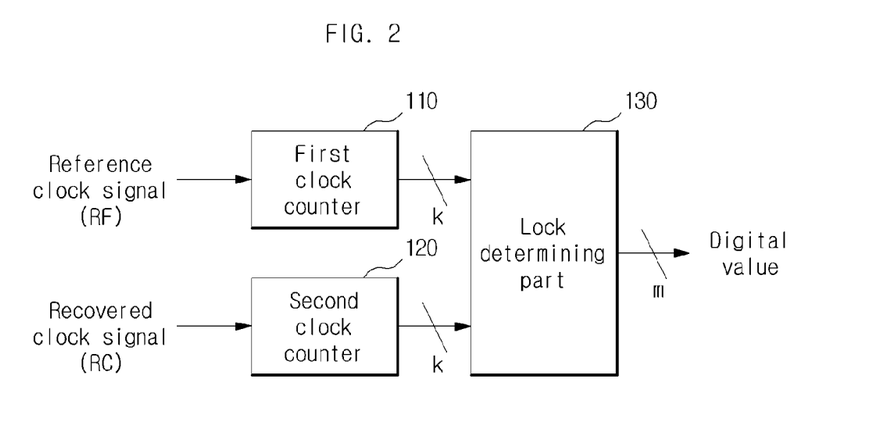
FIG. 2 is a block diagram illustrating internal configuration of the frequency lock detector in an apparatus for controlling supply voltage of clock and data recovery circuit according to an embodiment of the present invention.

FIG. 2 is a block diagram illustrating internal configuration of a frequency lock detector 100 in an apparatus for controlling supply voltage of clock and data recovery circuit according to an embodiment of the present invention.

Referring to FIG. 2, the frequency lock detector 100 according to an embodiment of the present invention may include a first clock counter 110, a second clock counter 120, and a lock determining part 130.

The first clock counter 110 may receive a reference clock signal(RF) and obtain the number of clock edges of the reference clock signal(RF). The second clock counter 120 may receive a recovered clock signal(RC) and obtain the number of clock edges of the recovered clock signal(RC).

The lock determining part 130 may receive the number of clock edges of the reference clock signal(RF) and the number of clock edges of the recovered clock signal(RC) and determine frequency lock by using the difference between the number of clock edges of the reference clock signal(RF) and the number of clock edges of the recovered clock signal(RC).

Figure 3:
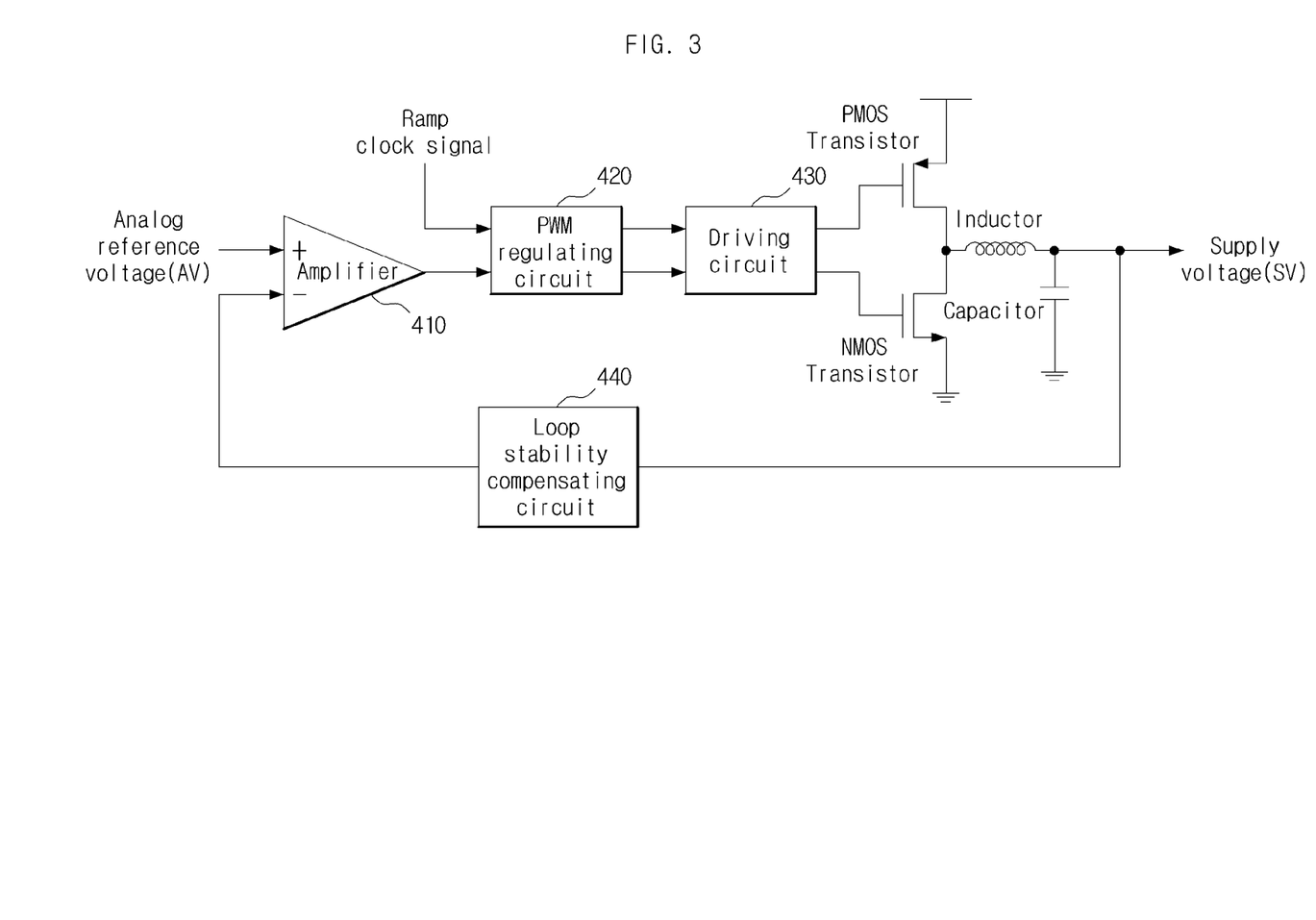
FIG. 3 is a block diagram illustrating internal configuration of a DC-DC converter in an apparatus for controlling supply voltage of clock and data recovery circuit according to an embodiment of the present invention.

FIG. 3 is a block diagram illustrating internal configuration of a DC-DC converter 400 in an apparatus for controlling supply voltage of clock and data recovery circuit according to an embodiment of the present invention.

Referring to FIG. 3, the DC-DC converter 400 according to an embodiment of the present invention may include an amplifier 410, a pulse width modulation (PWM) controlling circuit 420, a driving circuit 430 and a loop stability compensating circuit 440. The DC-DC converter 400 according to an embodiment of the present invention may further include a p-channel MOSFET (PMOS) transistor and an n-channel MOSFET (NMOS) transistor drived by the driving circuit 430 and further include an inductor and a capacitor.

The amplifier 410 may amplify the difference voltage between the analog reference voltage(AV) and the supply voltage(SV) outputted from the DC-DC converter 400. The PWM controlling circuit 420 may receive the amplified difference voltage from the amplifier and ramp clock signal, and generate PWM signal from the amplified difference voltage and the ramp clock signal. The driving circuit 430 may drive PMOS transistor and the NMOS transistor based on the PWM signal.

Figure 4:
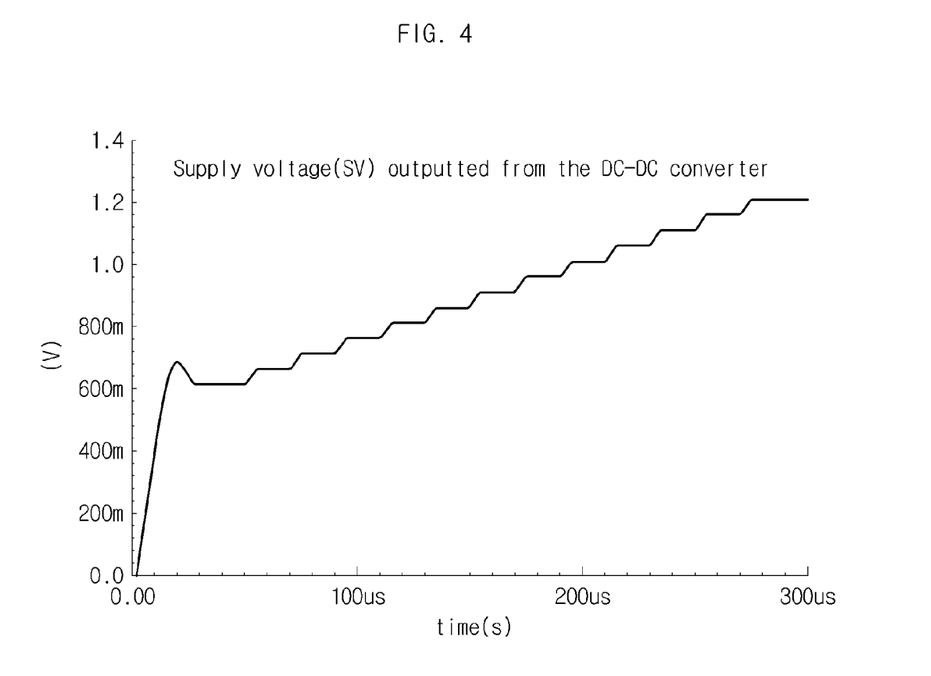
FIG. 4 illustrates supply voltage outputted from a DC-DC converter.

FIG. 4 illustrates supply voltage outputted from the DC-DC converter. Referring to FIG. 4, it may be noted that the supply voltage outputted from the DC-DC converter 400 starts from 0.6V and gradually increases to 1.2V and then remains steady. The initial output supply voltage(SV) starts from 0V and initializes to 0.6V and then when it is determined that an output supply voltage(SV) is low, can increase by 50 mV to output 0.65V. It is also noted that the output supply voltage(SV) may increase gradually through the same process to output 1.2V.

In an embodiment of the present invention, the DC-DC converter 400 may be one of a buck converter, a boost converter and a buck-boost converter. In particular, when the output supply voltage(SV) is always lower than the input voltage, it may be composed of the buck converter, while when the output supply voltage(SV) is always higher than the input voltage, it may be composed of the boost converter. In another embodiment, when the output supply voltage(SV) may be higher or lower than the input voltage, it may be composed of the buck-boost converter.

Figure 5:
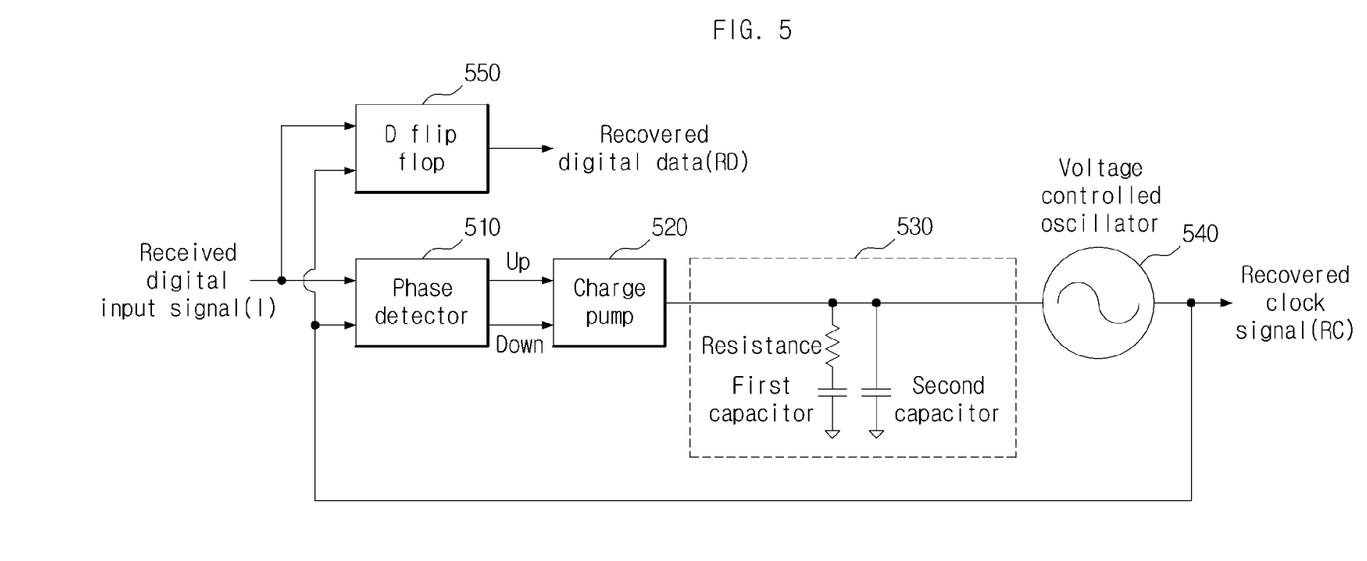
FIG. 5 is a block diagram illustrating internal configuration of a clock and data recovery circuit in an apparatus for controlling supply voltage of clock and data recovery circuit according to an embodiment of the present invention.

FIG. 5 is a block diagram illustrating internal configuration of a clock and data recovery circuit converter in an apparatus for controlling supply voltage of clock and data recovery circuit according to an embodiment of the present invention.

Referring to FIG. 5, the clock and data recovery circuit 500 according to an embodiment of the present invention may include a phase detector 510, a charge pump 520, a loop filter 530, a voltage controlled oscillator 540, and a D flip flop 550.

The phase detector 510 may compare phase of the received digital input signal(I) with that of the recovered clock signal (RC). The charge pump 520 may supply current according to up or down signal outputted from the phase detector 510. The loop filter 530 may receive the current outputted from the charge pump 520, and convert to the voltage to control the frequency of the voltage controlled oscillator 540. The voltage controlled oscillator 540 may receive the converted voltage from the loop filter 530 and output a recovered clock signal(RC). The D flip flop 550 may recover digital data(RD) from the received digital input signal(I) and the recovered clock signal(RC). The circuit in FIG. 5 is a general type of the clock and data recovery circuit 500 but it is not limited thereto.

Figure 6A:
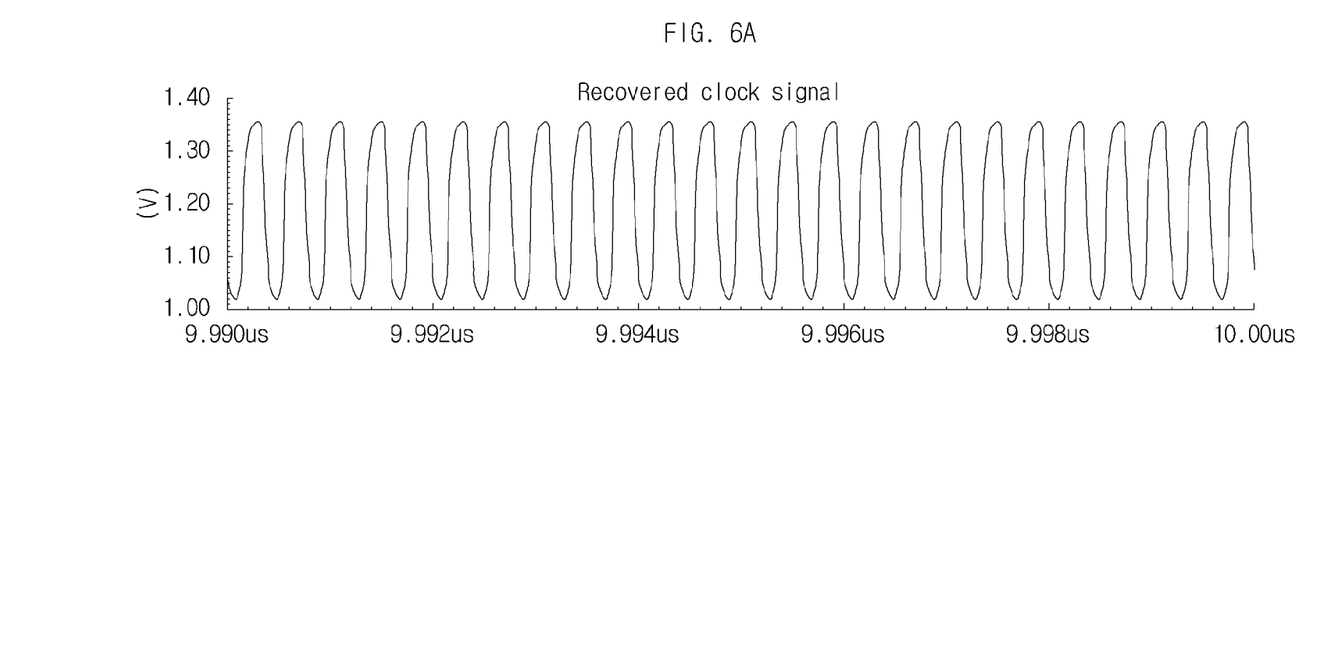
FIG. 6A, FIG. 6B and FIG. 6C illustrates signal waveforms at the main portion of an apparatus for controlling supply voltage of clock and data recovery circuit according to an embodiment of the present invention.
Figure 6B:
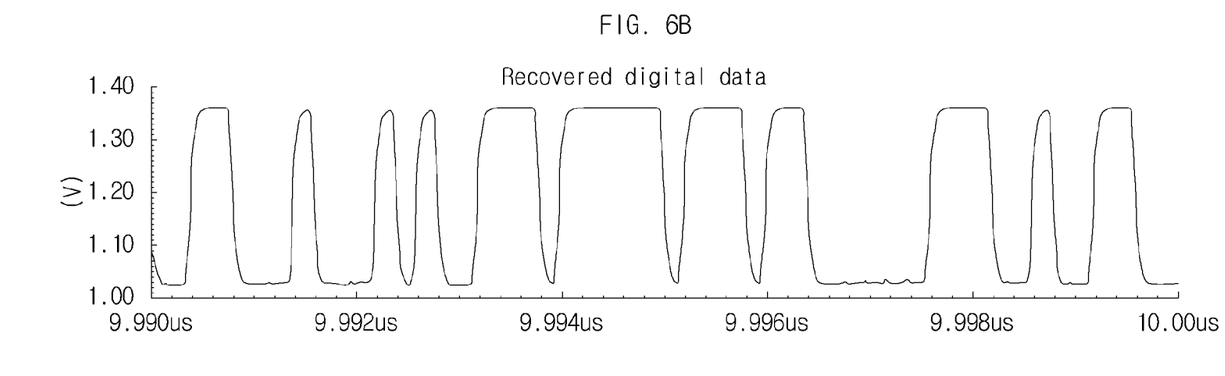
Figure 6C:
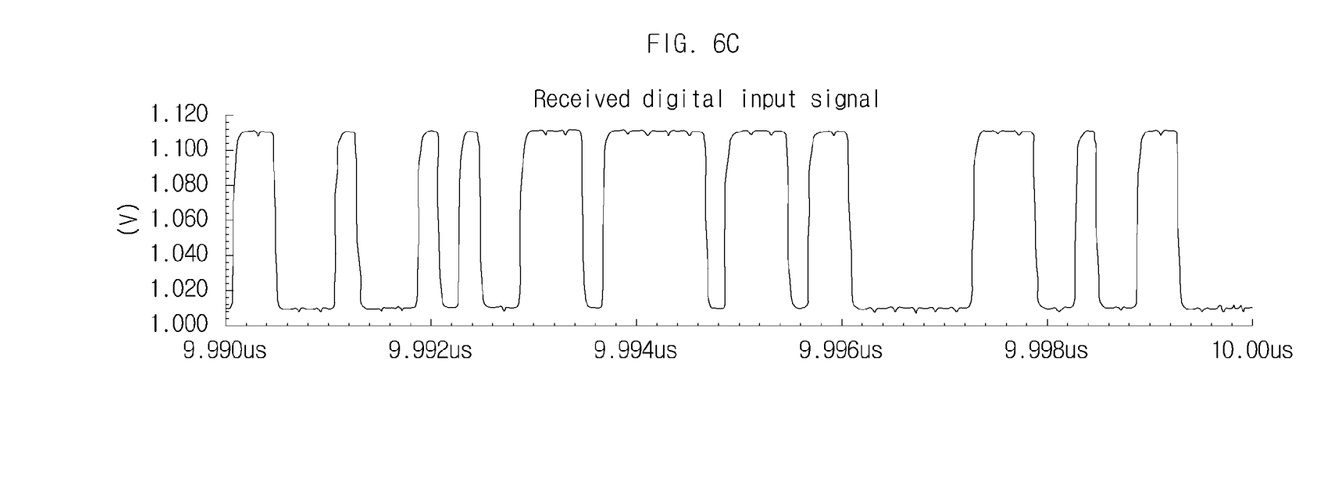

FIG. 6A, FIG. 6B and FIG. 6C illustrate signal waveforms at the main portion of an apparatus for controlling supply voltage of clock and data recovery circuit according to an embodiment of the present invention. FIG. 6A is a waveform of the recovered clock signal(RC) having an amplitude of 300 mV, FIG. 6B is a waveform of the recovered digital data(RD) having an amplitude of 300 mV, and FIG. 6C is a waveform of the received digital input signal(I) having an amplitude of 100 mV. When the digital input signal(I) such as FIG. 6C is applied to a clock and data recovery circuit in which the apparatus for controlling supply voltage of clock and data recovery circuit according to an embodiment of the present invention is provided, it is noted that the recovered clock signal(RC) such as FIG. 6A and the recovered digital data (RD) signal such as FIG. 6B can be obtained.

Figure 7:
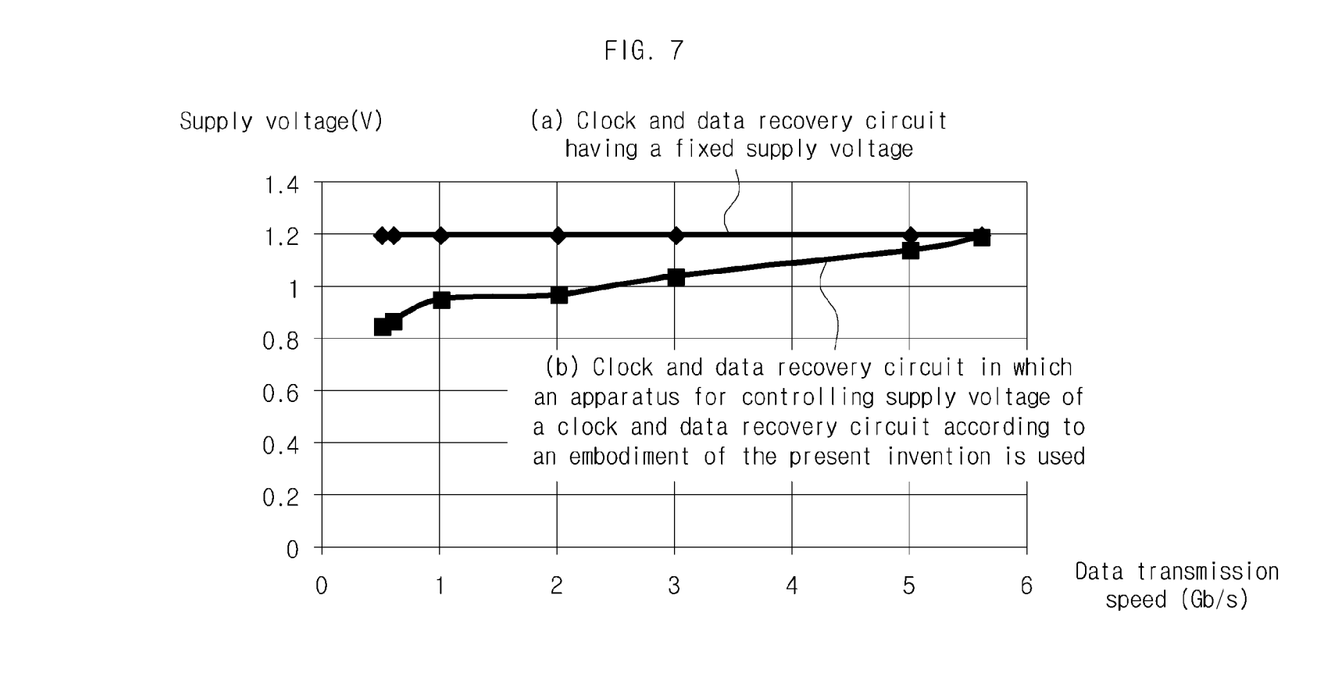
FIG. 7 illustrates supply voltages of a clock and data recovery circuit in which an apparatus for controlling supply voltage of a clock and data recovery circuit according to an embodiment of the present invention is used.

FIG. 7 illustrates supply voltages of a clock and data recovery circuit in which an apparatus for controlling supply voltage of a clock and data recovery circuit according to an embodiment of the present invention is used.

A conventional clock and data recovery circuit having a fixed supply voltage(SV) is supplied with 1.2V regardless of a data transmission speed, while the clock and data recovery circuit, in which the apparatus for controlling supply voltage of clock and data recovery circuit according to an embodiment of the present invention is used, is supplied with relatively low supply voltage(SV) when a data transmission speed is low, while is supplied with relatively high supply voltage(SV) when a data transmission speed is high.

Figure 8:
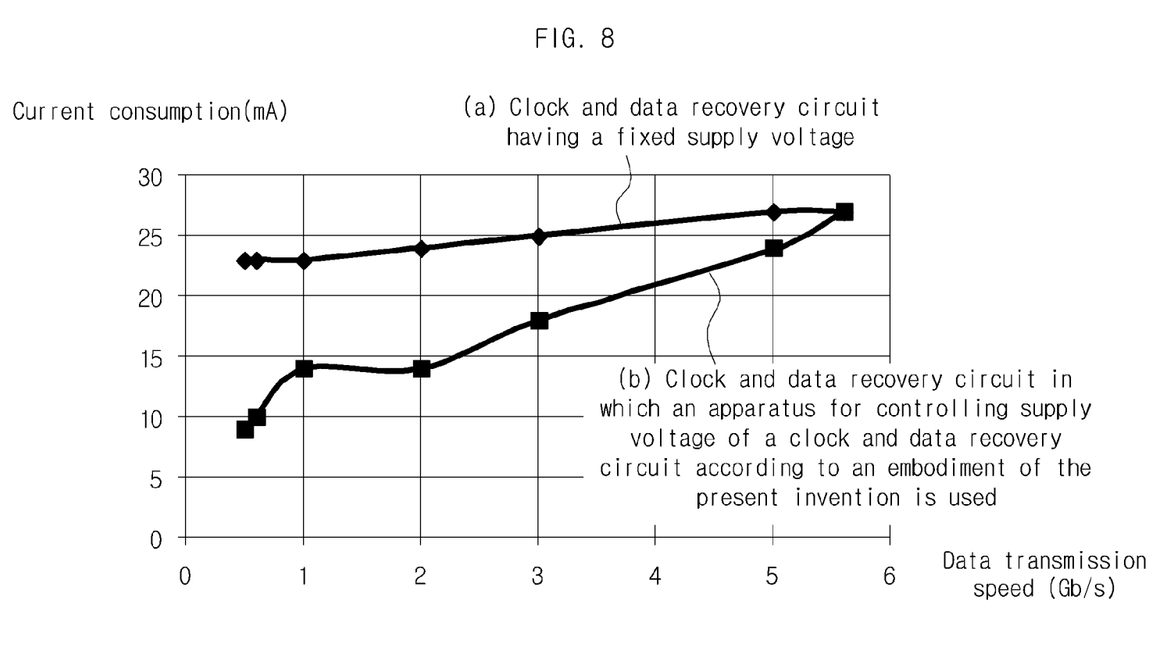
FIG. 8 illustrates current consumption of a clock and data recovery circuit in which an apparatus for controlling supply voltage of a clock and data recovery circuit according to an embodiment of the present invention is used.

FIG. 8 illustrates current consumption of a clock and data recovery circuit in which an apparatus for controlling supply voltage of a clock and data recovery circuit according to an embodiment of the present invention is used.

A conventional clock and data recovery circuit having a fixed supply voltage(SV) shows similar trends in current consumption regardless of a data transmission speed since it is always supplied with 1.2V regardless of a data transmission speed, while the clock and data recovery circuit, in which the apparatus for controlling supply voltage of clock and data recovery circuit according to an embodiment of the present invention is used, shows low current consumption since it is supplied with relatively low supply voltage(SV) when a data transmission speed is low.

Figure 9:
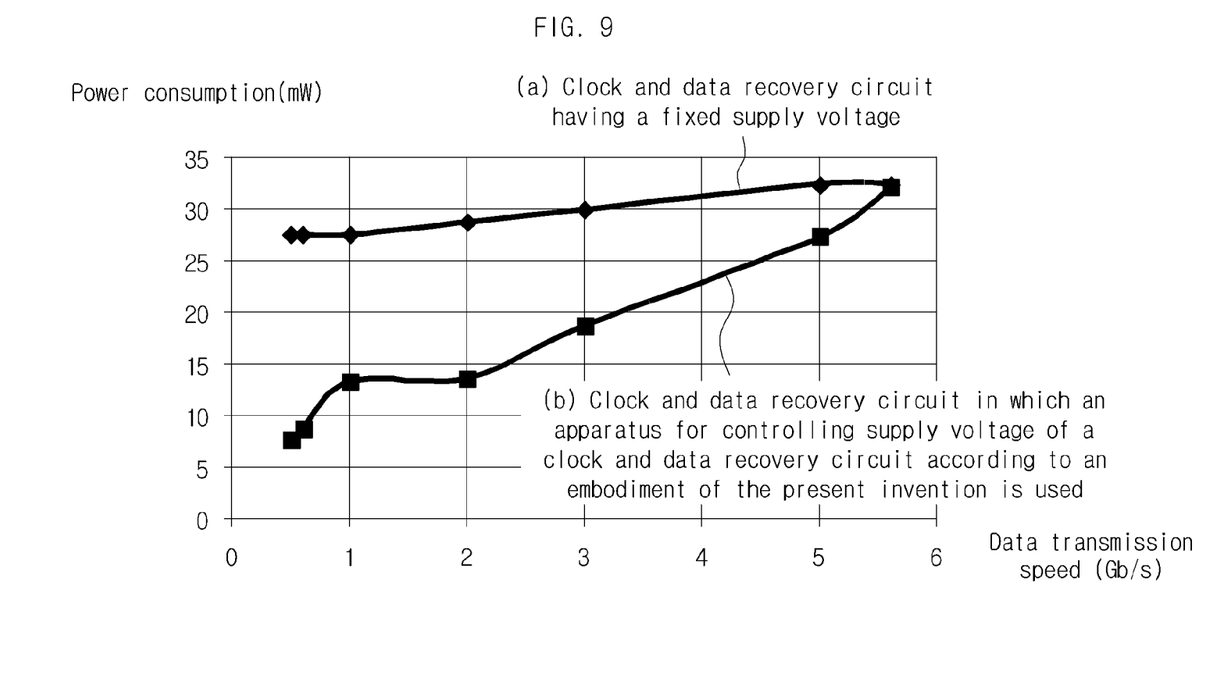
FIG. 9 illustrates power consumption of a clock and data recovery circuit in which an apparatus for controlling supply voltage of a clock and data recovery circuit according to an embodiment of the present invention is used.

FIG. 9 illustrates power consumption of a clock and data recovery circuit in which an apparatus for controlling supply voltage of a clock and data recovery circuit according to an embodiment of the present invention is used.

Power consumption is represented by the product of the supply voila (SV) and the current consumption.

Therefore, the method and apparatus for controlling supply voltage of clock and data recovery circuit according to an embodiment of the present invention can reduce power consumption of the clock and data recovery circuit when the data transmission speed gets lower, compared the conventional clock and data recovery circuit having a fixed supply voltage (SV). That is, when the data transmission speed is low, it is more efficient in terms of energy consumption per one bit of data.

Methods and algorithm processes explained by combining exemplary embodiments of the present invention may be implemented in hardware, software module executed by a processor or a combination thereof. The software module may be implemented in a RAM memory, a flash memory, a ROM memory, an EPROM memory, an EEPROM memory, a register, a hard disc, a detachable disc, a CD-ROM, or a storage medium in another form known in the art. The software module may be connected to the processor which can read information from the storage medium and record information in the storage medium. Alternatively, the storage medium can be included in the processor. The processor and the storage medium can be included in application specific integrated circuit(ASIC). The ASIC can be included in a user's terminal. Alternatively, the processor and the storage medium can be included as separate components in a user's terminal. All processes described above can be implemented in software code modules executing in one or more of general or special purpose computers or processors and can be fully automated through the software code modules. The code modules can be stored in any type of a computer readable medium or a computer storage device or a set of storage devices. Some or all methods can be implemented in a computer hardware.

All methods and tasks described above may be executed and fully automated in a computer system. The computer system, in some cases, may include multiple individual computers or computing devices (i.e., physical servers, workstations, storage arrays and the like). Each computing device generally includes a memory, program instructions stored in another non-transitory computer readable storage medium or a processor (or multiprocessors or circuit or a set of circuits, for example, module) executing modules. Some or all functions described above can be implemented by application specific circuits (for example, ASICs or FPGAs) of the computer system but the described various functions can be implemented by program instructions. When the computer system is included in several computing devices, such devices are not needed to be arranged at the same position but can be arranged at the same position. The methods and results of tasks described above can be permanently stored in different states by transforming physical storage devices such as solid state memory chips and/or magnetic discs.

While it has been described with reference to particular embodiments, it is to be appreciated that various changes and modifications may be made by those skilled in the art without departing from the spirit and scope of the embodiment herein, as defined by the appended claims and their equivalents. Thus, it is intended that the present invention covers all such modifications provided they come within the scope of the appended claims and their equivalents.

What is claimed is:

1. An apparatus for controlling supply voltage of clock and data recovery circuit comprising:
   a frequency lock detector configured to compare a frequency of a recovered clock signal with a frequency of a reference clock signal periodically and output a digital value corresponding to the result determined as that the frequency of recovered clock signal is higher than, lower than, or equal to the frequency of a reference clock signal;
   a digital counter configured to receive the digital value from the frequency lock detector and converting to a counter value based on the digital value;
   a digital-to-analog converter configured to receive the counter value from the digital counter and generate analog reference voltage corresponding to the counter value;

a DC-DC converter configured to receive the analog reference voltage from the digital-to-analog converter and output supply voltage corresponding to the analog reference voltage; and a clock and data recovery circuit configured to receive the supply voltage from the DC-DC converter and generate the recovered clock signal and recovered digital data from a received digital input signal by using the supply voltage.

2. The apparatus of claim 1, wherein the frequency lock detector comprises:

a first clock counter configured to receive the reference clock signal and obtain the number of clock edges of the reference clock signal;

a second clock counter configured to receive the recovered clock signal and obtain the number of clock edges of the recovered clock signal; and a lock determining part configured to receive the number of clock edges of the reference clock signal and the number of clock edges of the recovered clock signal, determine frequency lock by using the difference between the number of clock edges of the reference clock signal and the number of clock edges of the recovered clock signal, and output a digital value corresponding to the result determined as that the frequency of recovered clock signal is higher than, lower than, or equal to the frequency of a reference clock signal.

3. The apparatus of claim 1, wherein the digital value is 2 bits to represent for when the frequency of recovered clock signal is higher than, lower than, or equal to the frequency of a reference clock signal, wherein the digital value is 1 bit to represent for when the frequency of recovered clock signal is higher than or equal to the frequency of a reference clock signal, and wherein the digital value is 1 bit to represent for when the frequency of recovered clock signal is lower than or equal to the frequency of a reference clock signal.

4. The apparatus of claim 1, wherein the DC-DC converter is one of a buck converter, a boost converter and a buck-boost converter.

5. The apparatus of claim 1, wherein the DC-DC converter comprises:

an amplifier configured to amplify the difference voltage between the analog reference voltage and the supply voltage outputted from the DC-DC converter;

a PWM controlling circuit configured to receive the amplified difference voltage from the amplifier and a ramp clock signal and generate a PWM signal from the amplified difference voltage and the ramp clock signal; and a driving circuit configured to drive a PMOS transistor and an NMOS transistor based on the PWM signal.

6. A method for controlling supply voltage of clock and data recovery circuit, the method comprising:

comparing, by a frequency lock detector, a frequency of a recovered clock signal with a frequency of a reference clock signal periodically and outputting, by the frequency lock detector, a digital value corresponding to the result determined as that the frequency of recovered clock signal is higher than, lower than, or equal to the frequency of a reference clock signal;

receiving, by a digital counter, the digital value from the frequency lock detector and converting, by the digital counter, to a counter value based on the digital value;

receiving, by a digital-to-analog converter, the counter value from the digital counter and generating, by the digital-to-analog converter, analog reference voltage corresponding to the counter value;

receiving, by a DC-DC converter, the analog reference voltage from the digital-to-analog converter and outputting, by the DC-DC converter, supply voltage corresponding to the analog reference voltage; and receiving, by a clock and data recovery circuit, the supply voltage from the DC-DC converter and generating, by the clock and data recovery circuit, the recovered clock signal and recovered digital data from a received digital input signal by using the supply voltage.

7. The method of claim 6, wherein the outputting a digital value by a frequency lock detector comprises:

receiving the reference clock signal and obtaining the number of clock edges of the reference clock signal by a first clock counter;

receiving the recovered clock signal and obtaining the number of clock edges of the recovered clock signal by a second clock counter; and receiving the number of clock edges of the reference clock signal and the number of clock edges of the recovered clock signal, determining frequency lock by using the difference between the number of clock edges of the reference clock signal and the number of clock edges of the recovered clock signal, and outputting a digital value corresponding to the result determined as that the frequency of recovered clock signal is higher than, lower than, or equal to the frequency of a reference clock signal by a lock determining part.

8. The method of claim 6, wherein the digital value is 2 bits to represent for when the frequency of recovered clock signal is higher than, lower than, or equal to the frequency of a reference clock signal, wherein the digital value is 1 bit to represent for when the frequency of recovered clock signal is higher than or equal to the frequency of a reference clock signal, and wherein the digital value is 1 bit to represent for when the frequency of recovered clock signal is lower than or equal to the frequency of a reference clock signal.

9. The method of claim 6, wherein the DC-DC converter is one of a buck converter, a boost converter and a buck-boost converter.

10. The method of claim 6, wherein the outputting supply voltage by a DC-DC converter comprises:

amplifying the difference voltage between the analog reference voltage and the supply voltage outputted from the DC-DC converter by an amplifier;

receiving the amplified difference voltage from the amplifier and a ramp clock signal and generating a PWM signal from the amplified difference voltage and the ramp clock signal by a PWM controlling circuit; and driving a PMOS transistor and an NMOS transistor based on the PWM signal by a driving circuit.

* * * * *